United States Patent
Yasuda

(10) Patent No.: US 6,930,938 B2
(45) Date of Patent: Aug. 16, 2005

(54) SEMICONDUCTOR MEMORY DEVICE HAVING TEST MODE

(75) Inventor: Kenichi Yasuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 146 days.

(21) Appl. No.: 10/442,974

(22) Filed: May 22, 2003

(65) Prior Publication Data

US 2004/0105334 A1 Jun. 3, 2004

(30) Foreign Application Priority Data

Nov. 28, 2002 (JP) ........................................ 2002-345255

(51) Int. Cl.[7] ............................................. G11C 29/00
(52) U.S. Cl. ....................... 365/201; 365/190; 365/203
(58) Field of Search ........................... 365/63, 149, 190, 365/201, 203

(56) References Cited

U.S. PATENT DOCUMENTS 5,995,427 A * 11/1999 Tsukikawa ................... 365/201
6,707,738 B2 * 3/2004 Choi et al. ................... 365/203
6,735,133 B1 * 5/2004 Tsukikawa ................... 365/201

FOREIGN PATENT DOCUMENTS

| JP | 10-269775 | 10/1998 |
|---|---|---|
| JP | P2001-68634 A | 3/2001 |

* cited by examiner

Primary Examiner—Son Mai
(74) Attorney, Agent, or Firm—McDermott Will & Emery LLP

(57) ABSTRACT

In a burn-in test, a sense amplifier circuit is separated from each bit line by a bit line separation switch. In this state, a bit line switch circuit connects one of complementary bit lines to a first voltage node, and connects the other complementary bit line to a second voltage node in blocks on both sides. A first bit line voltage supplied by the first voltage node and a second bit line voltage supplied by the second voltage node can be set independently of each other at least in the burn-in test.

5 Claims, 9 Drawing Sheets

SEMICONDUCTOR MEMORY DEVICE HAVING TEST MODE

BACKGROUND OF THE INVENTION

1. Field of the Invention

The present invention relates to a semiconductor memory device, and more particularly to a semiconductor memory device which performs an acceleration test (a burn-in test) for detecting an internal short-circuited path.

2. Description of the Background Art

In a semiconductor memory device such as a dynamic random access memory (DRAM), a short-circuited path sometimes generates between a bit line and a node other than the bit line in fabrication. If a leak current which is generated on the short-circuited path is minute, it is difficult to detect the short-circuited path by a normal operation test. In the present specification, such a short-circuited path which causes only a minute leak current at a normal operating voltage and which is thereby difficult to detect will be sometimes referred to as "minute leak path".

If a semiconductor memory device is provided as a finished product without detecting a minute leak current, problems of a low in operation margin and an increase in power consumption arise as a result of the generation of a stationary minute leak current. In order to ensure rejecting semiconductor memory devices which have such minute leak paths, therefore, a burn-in test for detecting the minute leak paths by applying a voltage stress higher than that at the time of the normal operation is normally performed. Various configurations for applying a predetermined high voltage to a bit line in the burn-in test have been proposed so far.

In order to prevent thin film transistors which constitute a sense amplifier circuit from being destroyed by applying a high voltage to a bit line at the time of the burn-in test, a configuration that the bit line is separated from the sense amplifier circuit at the time of the burn-in test is disclosed for example in Japanese Patent Laying-Open No. 2001-68634.

Further, a configuration that predetermined voltages are applied to each of bit lines in order to perform batch data writing at the time of a test mode and a configuration that different levels of voltages (high and low voltages) are applied to each of bit lines in odd-numbered columns and each of bit lines in even-numbered columns, although they are not directly relevant to a burn-in test, are disclosed for example in Japanese Patent Laying-Open No. 10-269775.

There are a plurality of types of minute leak paths for bit lines, so that minute leak currents may generate between a bit line and a node other than the bit line (e.g., a word line) and between the bit lines. With a folded bit line configuration, a minute leak current may possibly generate between complementary bit lines which constitute the same bit line pair.

For example, a minute leak path between a bit line and a node other than the bit line can be detected by applying the same high voltage to each of the bit lines in a burn-in test. However, in order to detect the minute leak path which generates between the bit lines, it is necessary to set different voltages to adjacent bit lines. With the folded bit line configuration, in particular, it is necessary to apply a voltage stress a portion between complementary bit lines which constitute the same bit line pair or between the bit lines equal or opposite in phase.

With each of the configurations disclosed in the patent publications, it is impossible to detect all the various types of minute leak paths which generate to the portions between the bit lines only by the burn-in test in a state where the sense amplifier circuit is separated from the bit lines. In other words, it is necessary to perform a burn-in test for applying a high voltage to the bit line by writing data through the sense amplifier circuit. Such a burn-in test, however, may possibly destroy thin film transistors in the sense amplifier circuit, so that it is difficult to perform the burn-in test.

SUMMARY OF THE INVENTION

It is an object of the present invention to provide a semiconductor memory device with a configuration for performing a burn-in test capable of efficiently detecting a minute leak path between bit lines without using a sense amplifier circuit.

A semiconductor memory device according to an aspect of the present invention includes: a plurality of memory cells arranged in a matrix; a plurality of bit line pairs provided corresponding to columns of the plurality of memory cells; and a plurality of sense amplifier units provided corresponding to the plurality of bit line pairs, respectively. Each of the plurality of bit line pairs includes a first bit line and a second bit line. Each of the plurality of sense amplifier units includes: a sense amplifier circuit connected to the corresponding first and second bit lines corresponding to the sense amplifier circuit at least in data read; and a bit line switch for connecting the corresponding first and second bit lines to one and another one of a plurality of voltage nodes which can supply different voltages, respectively, in a test.

Therefore, a main advantage of the present invention is in that a desired voltage stress can be applied to a portion between complementary first and second bit lines which constitute each bit line pair without using a sense amplifier circuit in a test of a semiconductor memory device. Consequently, even if the sense amplifier circuit is formed from thin film transistors, it is possible to perform a burn-in test for detecting minute leak paths existing between the bit lines without destroying the thin film transistors.

A semiconductor memory device according to another aspect of the present invention includes: a plurality of memory cells arranged in a matrix; a plurality of bit line pairs provided corresponding to columns of the plurality of memory cells; and a plurality of sense amplifier units provided corresponding to the plurality of bit line pairs, respectively. Each of the plurality of bit line pairs includes a first bit line and a second bit line. Each of the plurality of sense amplifier units includes a sense amplifier circuit connected to the corresponding first and second bit lines at least in data read. Each of the sense amplifier units corresponding to the bit line pairs in odd numbers further includes a first bit line switch for connecting the corresponding first and second bit lines to a first voltage node in a test. Each of the sense amplifier units corresponding to the bit line pairs in even numbers further includes a second bit line switch for connecting the corresponding first and second bit lines to a second voltage node in the test. Voltages of the first and second voltage nodes can be set independently of each other in the test.

In such a thin film magnetic memory device, the even-numbered bit line pairs and odd-numbered bit line pairs can be connected to voltages which can be set independently of each other in a test of a semiconductor memory device by using the bit line switch (precharge and equalization circuit) capable of precharging each bit line pair at a predetermined voltage in the normal operation. As a result, it is possible to increase the number of types of detectable minute leak paths between the bit lines without increasing the circuit area of the sense amplifier units.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings.

First Embodiment (Entire Configuration)

Figure 1:
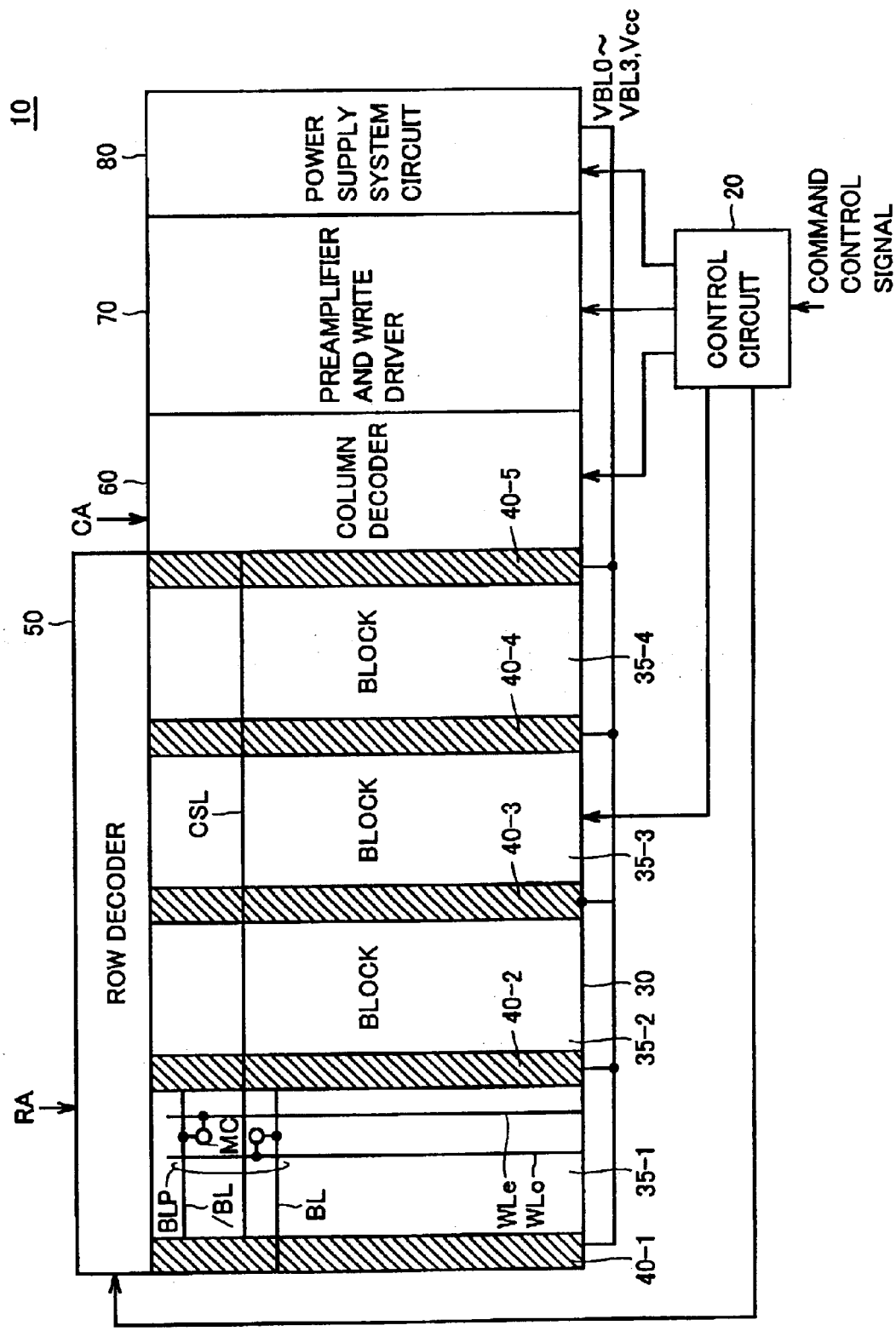
FIG. 1 is a schematic block diagram showing the configuration of a semiconductor memory device according to a first embodiment of the present invention.

With reference to FIG. 1, a semiconductor memory device 10 according to a first embodiment of the present invention, which is typically a DRAM, includes: a control circuit 20 which controls the entire operation of semiconductor memory device 10 in response to an external command control signal; and a memory array 30 in which a plurality of memory cells MC are arranged in a matrix.

Memory cell array 30 is divided into a plurality of blocks along a word line direction (row direction). In FIG. 1, memory array 30 is divided into, for example, four blocks of 35-1 to 35-4. Using regions in which blocks 35-1 to 35-4 are adjacent one another, sense amplifier bands 40-1 to 40-5 are provided. Hereinafter, blocks 35-1 to 35-4 and sense amplifier bands 40-1 to 40-5 will be generically, simply referred to as "blocks 35" and "sense amplifier bands 40", respectively.

In each of blocks 35, a word line WL is arranged corresponding to each memory cell row and a bit line pair BLP is arranged corresponding to each memory cell column for memory cells MC arranged in a matrix. Bit line pair BLP is formed from complementary bit lines BL and /BL.

Memory cells MC are connected to bit lines BL and /BL in every other row. For example, memory cell MC is connected to bit line BL in an odd-numbered row, and memory cell MC is connected to bit line /BL in an even-numbered row. FIG. 1 typically shows corresponding word lines WLe (in the even-numbered row) and WLo (in the odd-numbered row) and bit lines BL and /BL (in the same column) for memory cells MC which belong to the even-numbered row and the odd-numbered row, respectively, in block 35-1.

Semiconductor memory device 1 according to the first embodiment also includes a row decoder 50, a column decoder 60, a preamplifier and write driver 70 and a power supply system circuit 80.

Row decoder 50 selects one of blocks 35-1 to 35-4 in response to a row address RA, and activates one word line WL in the selected block. Accordingly, in the selected block, memory cells MC are connected to each of bit lines BL when an odd-numbered row is selected and connected to each of bit lines /BL when an even-numbered row is selected.

Column decoder 60 selectively activates one of column select lines CSL which are provided corresponding to memory cell columns, respectively. Column select lines CSL are commonly provided to blocks 35-1 to 35-4.

Preamplifier and write driver 70 amplifies data read from a selected memory cell when data is read, and drives inputted write data when data is written.

Power supply system circuit 80 generates various power supply voltages which are used inside semiconductor memory device 10. These power supply voltages involve a power supply voltage Vcc which is an operating voltage for memory cell array 30 and bit line voltages VBL, VBL0 to VBL3 which will be described later.

The configuration of the sense amplifier unit which constitute sense amplifier band 40 will next be described in detail. In order to compare with the configuration of the sense amplifier unit according to the first embodiment, the configuration of a sense amplifier unit shown as comparative example will be described first.

(Configuration of Sense Amplifier Band Shown as Comparative Example)

Figure 2:
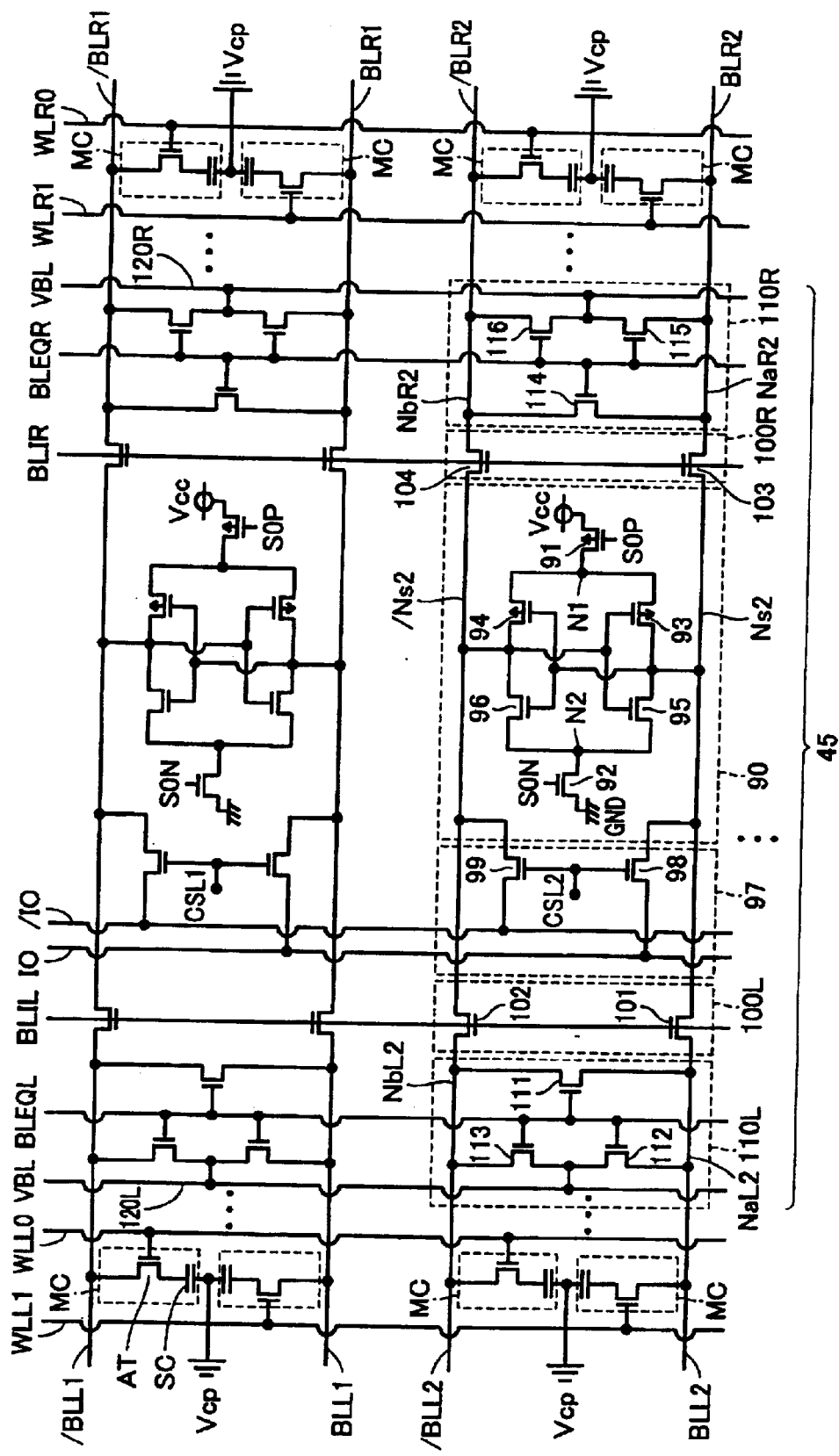
FIG. 2 is a circuit diagram showing the configuration of a sense amplifier unit shown as comparative example.

FIG. 2 is a circuit diagram showing the configuration of a sense amplifier unit shown as comparative example. FIG. 2 shows the configuration of sense amplifier band 40 which is located in a portion interposed between two blocks 35.

With reference to FIG. 2, in sense amplifier band 40, a sense amplifier unit (S/A unit) 45 is arranged for each memory cell column, i.e., each bit line pair. Since sense amplifier band 40 has a so-called shared sense configuration, sense amplifier unit 45 is shared between left and right blocks. The configuration of sense amplifier unit 45 corresponding to the second memory cell column will be typically described later.

In the left block of sense amplifier unit 45, bit lines BLL2 and /BLL2 which constitute a bit line pair are arranged. Further, word lines WLL0 and WLL1 are shown as a typical example of word lines corresponding to an odd-numbered row and an even-numbered row, respectively.

Each of memory cells MC in the even-numbered row includes an access transistor AT and a storage capacitor SC which are connected in series between bit line /BLL2 and a cell plate voltage Vcp. For example, the gate of access transistor AT is connected to corresponding word line WLL0. Likewise, in each of memory cells MC in the odd-numbered row, access transistor AT and storage capacitor SC are connected in series between bit line BLL2 and cell plate voltage Vcp. For example, the gate of access transistor AT is connected to corresponding word line WLL1.

Similarly, in the right block of sense amplifier unit 45, bit lines BLR2 and /BLR2 which constitute a bit line pair are arranged, and word lines WLR0 and WLR1 are shown as a typical example of word lines corresponding to an odd-numbered row and an even-numbered row, respectively. Further, memory cells MC are arranged in the same manner as that of memory cells MC in the left block.

Hereinafter, if the bit lines in the left block are generically expressed without making one them correspond to specific memory cell columns, they will be referred to as "BLL and /BLL". If the bit lines in the right block are generically expressed, they will be referred to as "BLR and /BLR". In addition, if complementary bit lines are generically expressed without specifying the right or left block, they will be simply referred to as "bit lines BL and /BL".

Sense amplifier unit 45 includes: a sense amplifier circuit 90 which is formed from transistors 91 to 96; a column select switch 97; bit line separation switches 100L and 100R; and precharge and equalization circuits 110L and 110R.

Sense amplifier circuit 90 includes: a P-MOS transistor 91 which is connected between power supply voltage Vcc and a node N1; an N-MOS transistor 92 which is connected between a node N2 and a ground voltage GND; P-MOS transistors 93 and 94 which are connected between node N1 and sense nodes Ns2 and /Ns2, respectively; and N-MOS transistors 95 and 96 which are connected between sense nodes Ns2 and /NS2 and node N2, respectively. Sense amplifier operation signals SOP and SON are inputted into the gates of transistors 91 and 92, respectively. The gates of transistors 93 and 95 are connected to sense node /Ns2 and those of transistors 94 and 96 are connected to sense node Ns2.

In the operative period of sense amplifier circuit 90, sense amplifier operation signals SOP and SON are activated to L level and H level, respectively, and nodes N1 and N2 are connected to power supply voltage Vcc and ground voltage GND, respectively. As a result, sense amplifier circuit 90 amplifies a minute voltage difference which is generated between sense nodes Ns2 and /Ns2 to the voltage difference between power supply voltage Vcc and ground voltage GND in the operative period. In the inoperative period of sense amplifier 90, sense amplifier operation signals SOP and SON are inactivated to H level and L level, respectively, nodes N1 and N2 are separated from power supply voltage Vcc and ground voltage GND, respectively, and no power is consumed by sense amplifier 90.

Generally, transistors 91 to 96 which constitute sense amplifier circuit 90 are formed from thin film transistors having high operation speed in order to accelerate the amplification operation of sense amplifier circuit 90. Namely, the gate insulation films of transistors 91 to 96 are designed to be thinner than those of the other transistors (transistor switches 111 to 116 and the like) connected to the bit lines.

Column select switch 97 includes transistor switches 98 and 99 which are connected between complementary data lines IO and /IO and sense nodes Ns2 and Ns2, respectively. Transistor switches 98 and 99 are formed from, for example, N-MOS transistors, and each of the gates thereof is connected to a corresponding column select line CSL2. Hereinafter, if the sense nodes are generically expressed without making them correspond to specific memory cell columns, they will be referred to as "Ns, /NS".

Therefore, when data is read or written, sense nodes Ns and /Ns corresponding to a selected column are connected to complementary data lines IO and /IO, respectively. Data lines IO and /IO are provided for each sense amplifier band 40, and transmit read data and write data to memory cell array 30. When data is read, preamplifier and write driver 70 shown in FIG. 1 amplifies the read data transmitted from sense amplifier circuit 90 in the selected column to data line IO and /IO. When data is written, preamplifier and write driver 70 drives data lines IO and /IO to complementary levels of voltages in accordance with the level of the written data.

Bit line separation switch 100L includes: a transistor switch 101 which is provided between a node NaL2 on bit line BLL2 and sense node Ns2; and a transistor switch 102 which is provided between a node NbL2 on bit line /BLL2 and sense node /Ns2. Likewise, bit line separation switch 100R includes: a transistor switch 103 which is provided between a node NaR2 on bit line BLR2 and sense node Ns2; and a transistor switch 104 which is provided between a node NbR2 on bit line /BLR2 and sense node/Ns2.

Each of transistor switches 101 to 104 is formed from an N-MOS transistor. A bit line separation signal BLIL is inputted into each of the gates of transistor switches 101 and 102, and a bit line separation signal BLIR is inputted into each of the gates of transistor switches 103 and 104.

In a normal operation, when the left block of sense amplifier unit 45 is selected as a data read or data write target block, bit line separation signal BLIL is set at H level and bit line separation signal BLIR is set at L level. Accordingly, in each memory cell column, bit lines BLL and /BLL are connected to sense nodes Ns and /Ns, respectively. Conversely, when the right block of sense amplifier unit 45 is selected as a target of data writing, bit line separation signal BLIL is set at L level and bit line separation signal BLIR is set at H level. Accordingly, in each memory cell column, bit lines BLR and /BLR are connected to sense nodes Ns and /Ns, respectively.

Further, sense amplifier circuit 90 which is connected to data lines IO and /IO in accordance with the column select result performs reading data and writing data from and to selected memory cells through bit lines BLL and /BLL or BLR and /BLR in the selected column.

Precharge and equalization circuit 110L includes: a transistor switch 111 which is provided between nodes NaL2 and NbL2; and transistor switches 112 and 113 which are provided between a voltage node 120L, to which a bit line voltage VBL is transmitted, and nodes NaL2 and NbL2, respectively. Likewise, precharge and equalization circuit 110R includes: a transistor switch 114 which is provided between nodes NaR2 and NbR2; and transistor switches 115 and 116 which are provided between a voltage node 120R, to which bit line voltage VBL is transmitted, and nodes NaR2 and NbR2, respectively. Each of transistor switches 111 to 116 are formed from an N-MOS transistor. Each of the gates of transistor switches 111 to 113 receives a bit line equalization signal BLEQL, and each of the gates of transistor switches 114 to 116 receives a bit line equalization signal BLEQR. In a normal operation, bit line equalization signals BLEQL and BLEQR are activated to H level during a predetermined period which corresponds to a data read or data write preparation period.

In the normal operation, therefore, each of bit lines BLL, /BLL, BLR and /BLR is precharged to bit line voltage VBL by appropriately activating bit line equalization signals BLEQL and BLEQR to H level.

On the other hand, in a burn-in test, by setting bit line voltage VBL supplied to voltage nodes 120L and 120R to be higher than that in the normal operation, precharge and equalization circuits 110L and 110R can apply higher voltage stresses than those in the normal operation to portions between bit lines BLL, /BLL, and BLR, /BLR and nodes other than the bit lines, respectively.

Furthermore, by setting bit line separation signals BLIL and BLIR at L level, respectively, sense nodes Ns and /Ns can be electrically separated from bit lines BLL, /BLL and BLR, /BLR in the blocks on the both sides in each sense amplifier unit 45. As a result, in the burn-in test in which high voltages can be applied to the respective bit lines, it is possible to protect thin film transistors 91 to 96 which constitute sense amplifier circuit 90.

It is noted that one of the left and right blocks does not exist in each of sense amplifier units 45 arranged in sense amplifier bands 40-1 and 40-5 arranged on the ends. Due to this, a set of bit line separation switch 100L and precharge and equalization circuit 110L or a set of bit line separation switch 100R and precharge and equalization circuit 110R are omitted from the configuration shown in FIG. 2.

Figure 3:
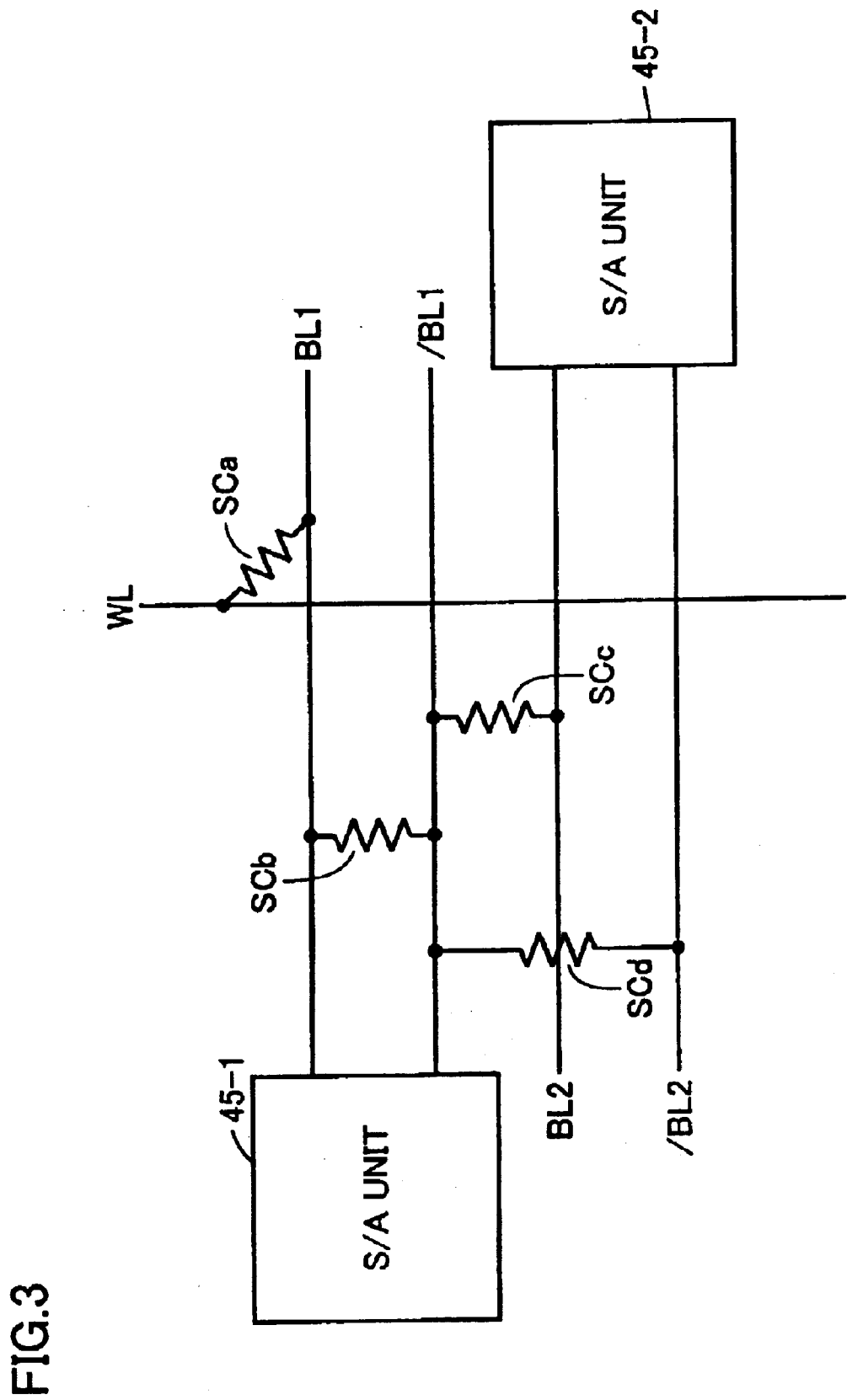
FIG. 3 is a conceptual diagram showing the types of minute leak paths related to bit lines.

FIG. 3 is a conceptual diagram showing the types of minute leak paths related to bit lines.

With reference to FIG. 3, a minute leak path SCa is generated between bit line BL1 and word line WL. Word line WL is shown as a typical example of a node other than the bit lines.

In contrast, minute leak paths SCb to SCd are generated between the bit lines. Specifically, minute leak path SCb is generated between the complementary bit lines (opposite in phase) which constitute the same bit line pair, minute leak path SCc is generated between the complementary bit lines opposite in phase which constitute adjacent bit line pairs, respectively and minute leak path SCd is generated between the bit lines equal in phase which constitute adjacent bit line pairs, respectively. In the example shown in FIG. 3, minute leak path SCb is generated between bit lines BL1 and /BL1, minute leak path SCc is generated between bit lines BL1 and BL2, and minute leak path SCd is generated between bit lines /BL1 and /BL2.

Hereinafter, a high-level voltage and a low-level voltage in the normal operation will be referred to as "H level" and "L level", and those in the burn-in test will be referred to as "H# level" and "L# level". Normally, the H level corresponds to operating power supply voltage Vcc of the memory cell array. As the H# level, a high voltage VCC# (>VCC) inputted from the outside or a boosting voltage Vpp (>VCC) for activating a word line is employed. In addition, the L level corresponds to ground voltage GND. As the L# level, ground voltage GND or a negative voltage Vbb (e.g., a substrate voltage) is employed.

In sense amplifier unit 45 shown in FIG. 2, precharge and equalization circuits 110L and 110R set each of bit lines BL at H# level and each of word lines WL is set at L# level in the burn-in test. Thereby, it is possible to apply a voltage stress higher than that in the normal operation to portions between the respective bit lines and word lines WL.

It is, therefore, possible to detect minute leak path SCa shown in FIG. 3 by the burn-in test using sense amplifier unit 45 shown in FIG. 2. As already described, bit line separation switches 100L and 100R can electrically separate each of the bit lines from the sense amplifier circuit. As a result, in the burn-in test for detecting minute leak path SCa, it is possible to protect thin film transistors 91 to 96 which constitute sense amplifier circuit 90.

On the other hand, in order to apply a high voltage stress to minute leak path SCb, it is possible to apply voltages at H# level and L# level to complementary bit lines BL and /BL which constitute the same bit line pair, respectively. However, with the configuration shown in FIG. 2, such a situation cannot be created by the supply of bit line voltage VBL using precharge and equalization circuits 110L and 110R.

In order to detect minute leak path SCb, therefore, it is necessary that sense amplifier circuit 90 (FIG. 2) in sense amplifier unit 45-1 performs data write with H# level and L# level set as operating voltages, and applies different voltages to the complementary bit lines. If such data write is performed, however, there is possibility of the destruction of the thin film transistors which constitute sense amplifier circuit 90.

Similarly, in the case of applying a high voltage stress to minute leak path SCc or SCd, it is necessary that sense amplifier unit 45-1 and 45-2 perform data write with H# level and L# level set as operating voltages in the burn-in test. Specifically, when minute leak path SCc is detected, it is necessary that sense amplifier units 45-1 and 45-2 write the same level of data. When minute leak path SCd is detected, it is necessary that sense amplifier units 45-1 and 45-2 write data at complementary levels. Therefore, similarly to the detection of minute leak path SDb, there is possibility of the destruction of the thin film transistors which constitute sense amplifier circuit 90.

According to the present invention, by contrast, it is possible to both protect the thin film transistors in the sense amplifier unit and to detect the minute leak paths between the bit lines. The configuration of the sense amplifier unit according to the present invention will now be described.
(Configuration of Sense Amplifier Unit According to the First Embodiment)

Figure 4:
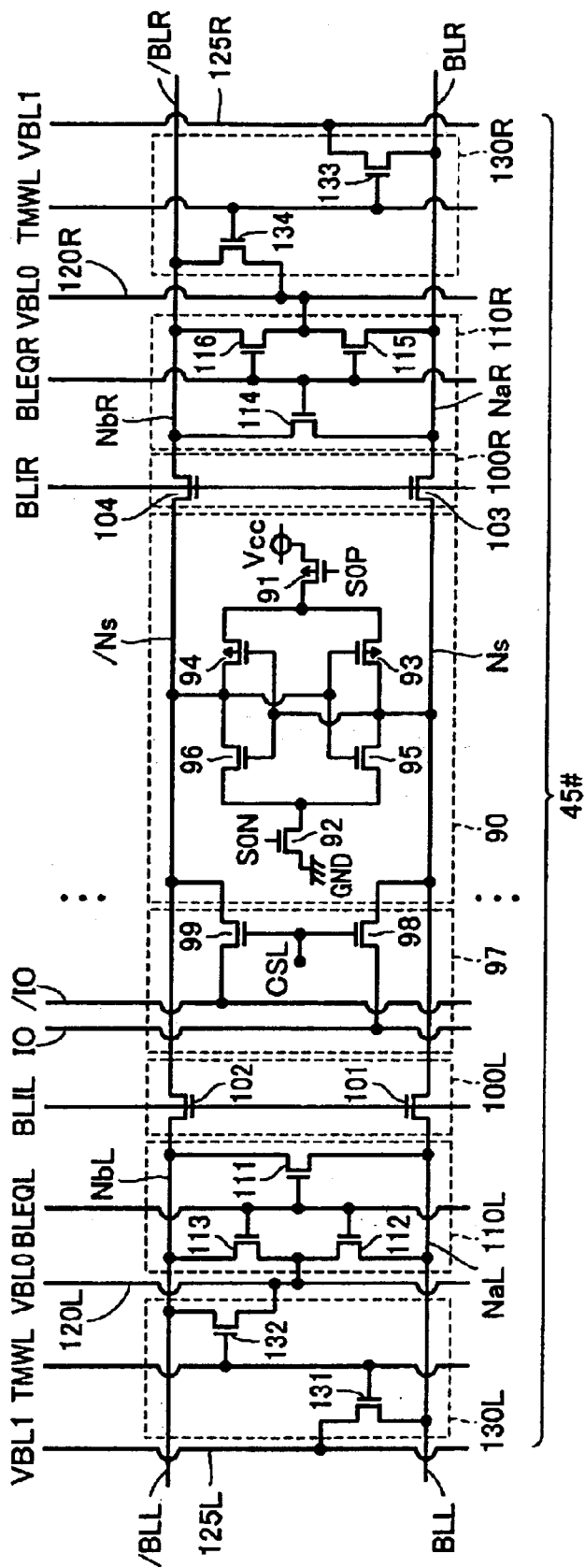
FIG. 4 is a circuit diagram showing the configuration of a sense amplifier unit according to the first embodiment.

FIG. 4 is a circuit diagram showing the configuration of a sense amplifier unit 45# according to the first embodiment of the present invention.

In FIG. 4, similarly to FIG. 2, one sense amplifier unit 45# in sense amplifier band 40 (one of sense amplifier bands 40-2 to 40-4 shown in FIG. 1) arranged between the left and right blocks is typically shown. It is assumed herein that the same configuration is provided in correspondence with each memory cell column.

With reference to FIG. 4, sense amplifier unit 45# according to the first embodiment differs from sense amplifier unit 45 shown in FIG. 2 in that bit line switch circuits 130L and 130R are further provided.

Bit line switch circuit 130L, which is provided in correspondence with the left block, includes: a transistor switch 131 which is provided between bit line BLL (node NaL) and a voltage node 125L; and a transistor switch 132 which is provided between bit line /BLL (node NbL) and voltage node 120L. Likewise, bit line switch circuit 130R, which is provided in correspondence with the right block, includes: a transistor switch 133 which is provided between bit line BLR (node NaR) and a voltage node 125R; and a transistor switch 134 which is provided between bit line /BLR (node NbR) and voltage node 120R.

Each of transistor switches 131 to 134 is formed from an N-MOS transistor, and each of the gate of transistor switches receives a test mode signal TMWL which is activated (to high level) in a burn-in test.

Voltage nodes 120L and 125L can be set at different voltage levels at least in the burn-in test. That is, while a voltage supplied from voltage node 120L is VBL0 and that supplied from voltage node 125L is VBL1, it is possible to set the supply voltages at VBL0=VBL1 or set at VBL0≠VBL1 to provide a desired voltage difference between VBL0 and VBL1. Voltage nodes 120R and 125R supply same voltages VBL0 and VBL1 as those of voltage nodes 120L and 125L, respectively.

As a result, in the burn-in test, it is possible to apply independent bit line voltages VBL1 and VBL0 to one bit lines BLL and BLR and the other bit lines /BLL and /BLR of the complementary bit lines, respectively while bit line separation switches 100L and 100R separate respective bit lines BLL, /BLL, BLR and /BLR from sense amplifier circuit 90.

It is noted that one of the left and right blocks does not exist in each of sense amplifier unit 45# arranged in sense amplifier bands 40-1 and 40-5 arranged on the ends. With this configuration, a set of bit line separation switch 100L, precharge and equalization circuit 110L and bit line switch circuit 130L or a set of bit line separation switch 100R, precharge and equalization circuit 110R and bit line switch circuit 130R are omitted from the configuration shown in FIG. 4.

Figure 5:
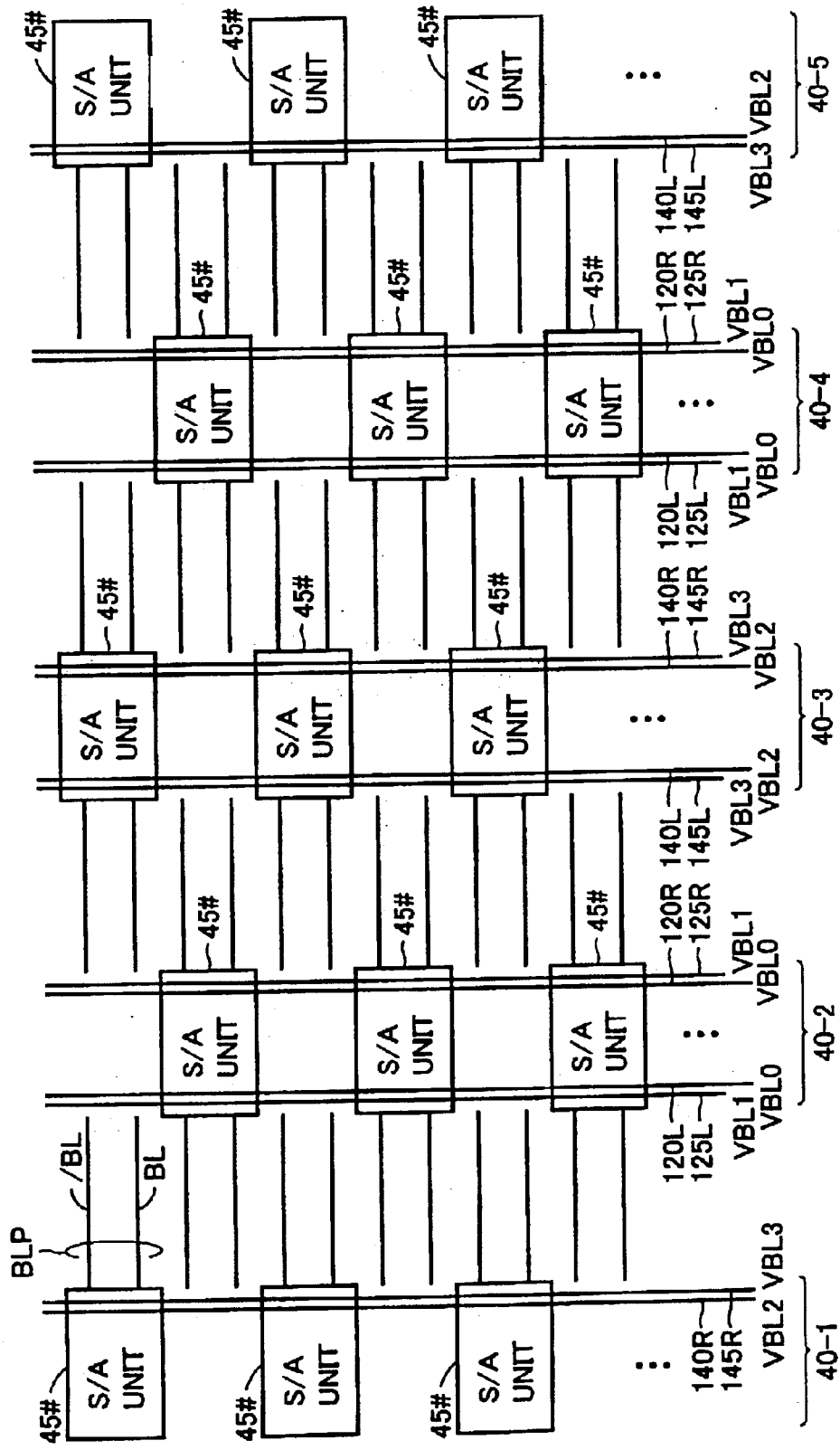
FIG. 5 is a block diagram for describing the supply of bit line voltages to the sense amplifier units according to the first embodiment on an entire memory cell array.

FIG. 5 is a block diagram for describing the supply of bit line voltages to the sense amplifier units according to the first embodiment on an entire memory cell array.

With reference to FIG. 5, as shown in FIG. 1, sense amplifier units 45# shown in FIG. 4 are arranged in a plurality of sense amplifier bands 40-1 to 40-5, respectively in accordance with the shared sense amplifier configuration in the memory cell array divided into four blocks.

Bit line voltages VBL1 and VBL0 are supplied to sense amplifier unit 45# arranged in each of even-numbered sense amplifier bands 40-2 and 40-4 by voltage nodes 120L, 125L, 120R and 125R as in the case of the configuration shown in FIG. 4.

In contrast, a bit line voltage VBL2 is supplied to sense amplifier unit 45# arranged in each of odd-numbered sense amplifier bands 40-1, 403 and 40-5, differently from sense amplifier 45# shown in FIG. 4, by voltage nodes 140L and 140R which replace voltage nodes 120L and 120R, respectively, and a bit line voltage VBL3 is supplied thereto by voltage nodes 145R and 145L which replace voltage nodes 125L and 125R, respectively.

With this configuration, it is possible to set different bit line voltages VBL0 to VBL3 independently of one another while separating a total of four bit lines BL, /BL between the adjacent bit line pairs from the sense amplifier circuit in the burn-in test.

Figure 6:
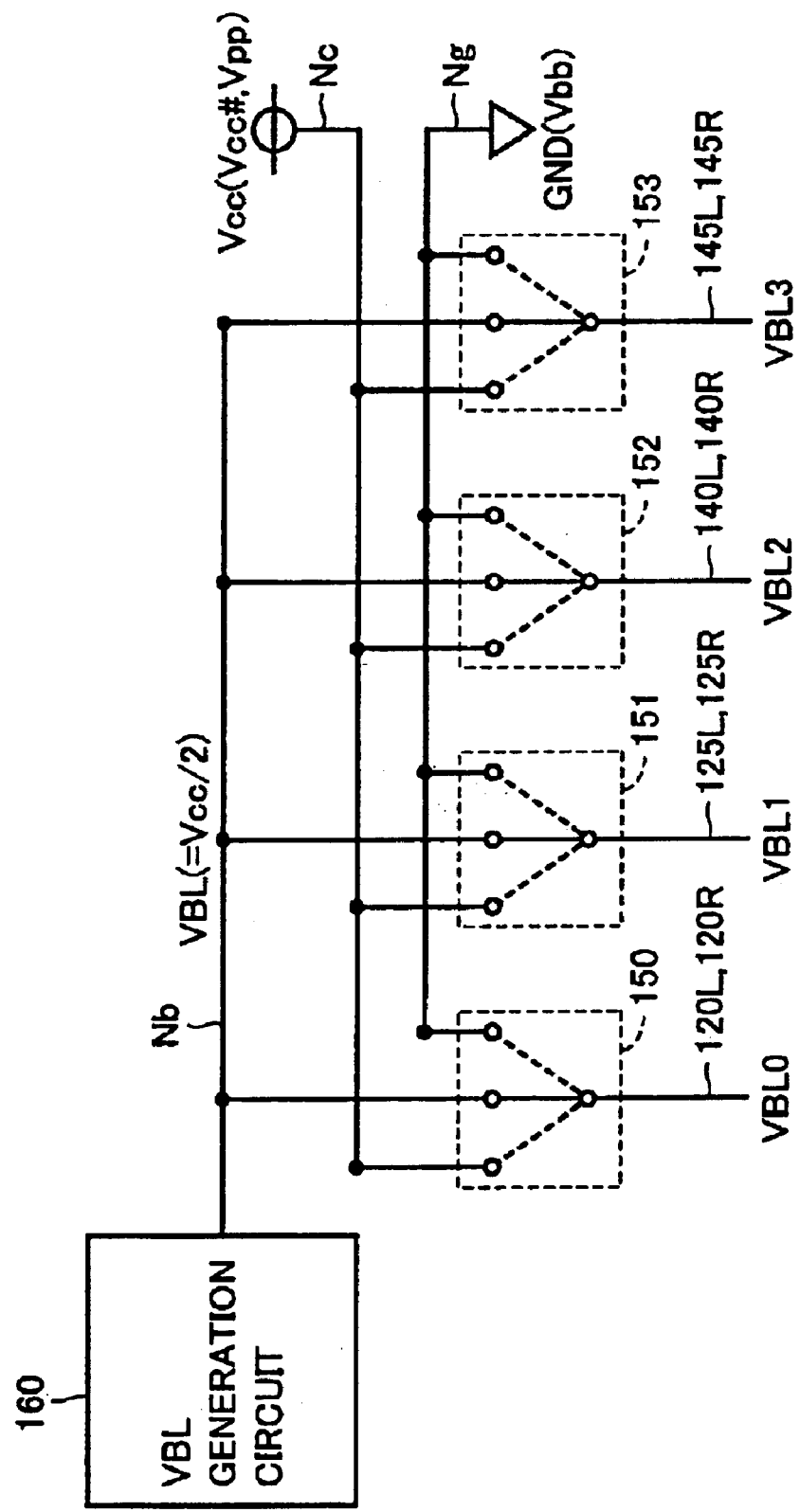
FIG. 6 is a block diagram showing a configuration for the supply of the bit line voltages shown in FIG. 5.

FIG. 6 is a block diagram showing the configuration of the supply of bit line voltages VBL0 to VBL3. FIG. 6 shows a configuration related to bit line voltages VBL0 to VBL3 in power supply system circuit 80 shown in FIG. 1.

With reference to FIG. 6, power supply voltage Vcc corresponding to H level is supplied to a voltage node Nc in a normal operation and a power supply voltage Vcc# or a boosting voltage Vpp corresponding to H# level is supplied thereto in a burn-in test. Ground voltage GND corresponding to L level is supplied to a power supply node Ng in the normal operation, and ground voltage GND or negative voltage Vbb corresponding to L# level is supplied thereto in the burn-in test. Bit line voltage generation circuit (VBL generation circuit) 160 supplies bit line voltage VBL (normally VBL=Vcc/2) corresponding to a precharge voltage in the normal operation to power supply node Nb.

A switch 150 is provided between voltage nodes 120L, 120R which supply bit line voltage VBL0 and power supply nodes Nc, Nb and Ng. Likewise, a switch 151 is provided in correspondence with voltage nodes 125L and 125R, a switch 152 is provided in correspondence with voltage nodes 140L and 140R, and a switch 153 is provided in correspondence with voltage nodes 145L and 145R.

In the normal operation, each of switches 150 to 153 connects the corresponding voltage node to power supply node Nb. With this configuration, each of the voltage nodes is set at bit line voltage VBL (Vcc/2) corresponding to a precharge voltage.

In the burn-in test, switches 150 to 153 connect corresponding voltage nodes to power supply node Nc (at H# level) or Ng (at L# level) in accordance with the type of a detected minute leak path.

By setting (VBL0, VBL1, VBL2, VBL3)=L#, L#, L#) and setting all word lines WL at H# level, a voltage stress for detecting minute leak path SCa shown in FIG. 3 can be applied thereto. Alternatively, by setting all word lines WL at L# level and setting (VBL0, VBL1, VBL2, VBL3)=(H#, H#, H#, H#), the same burn-in test can be performed.

By setting (VBL0, VBL1, VBL2, VBL3)=#, H#, L#, H#) or (VBL0, VBL1, VBL2, VBL3)=(H#, L#, H#, L#), voltage stresses for detecting minute leak paths SCb and SCc (shown in FIG. 3) between the bit lines opposite in phase in the same bit line pair or adjacent bit line pairs can be applied thereto.

Further, by setting (VBL0, VBL1, VBL2, VBL3)=(H#, H#, L#, L#) or (VBL0, VBL1, VBL2, VBL3)=(L#, H#, H#), a voltage stress for detecting minute leak current SCd (shown in FIG. 3) between the bit lines equal in phase of the adjacent bit line pairs can be applied thereto.

As described above, in the configuration according to the first embodiment, bit line voltages VBL0 to VBL3 which can be independently set can be applied to the four bit lines included in the adjacent bit line pairs without using the sense amplifier circuit in the burn-in test. Therefore, it is possible to apply voltage stresses for detecting the minute leak paths generated between the bit line while separating each of the bit lines from the sense amplifier circuit. As a result, even if the sense amplifier circuit is formed from thin film transistors in order to ensure high speed operation, it is possible to perform an effective burn-in test without destroying the thin film transistors.

Figure 7:
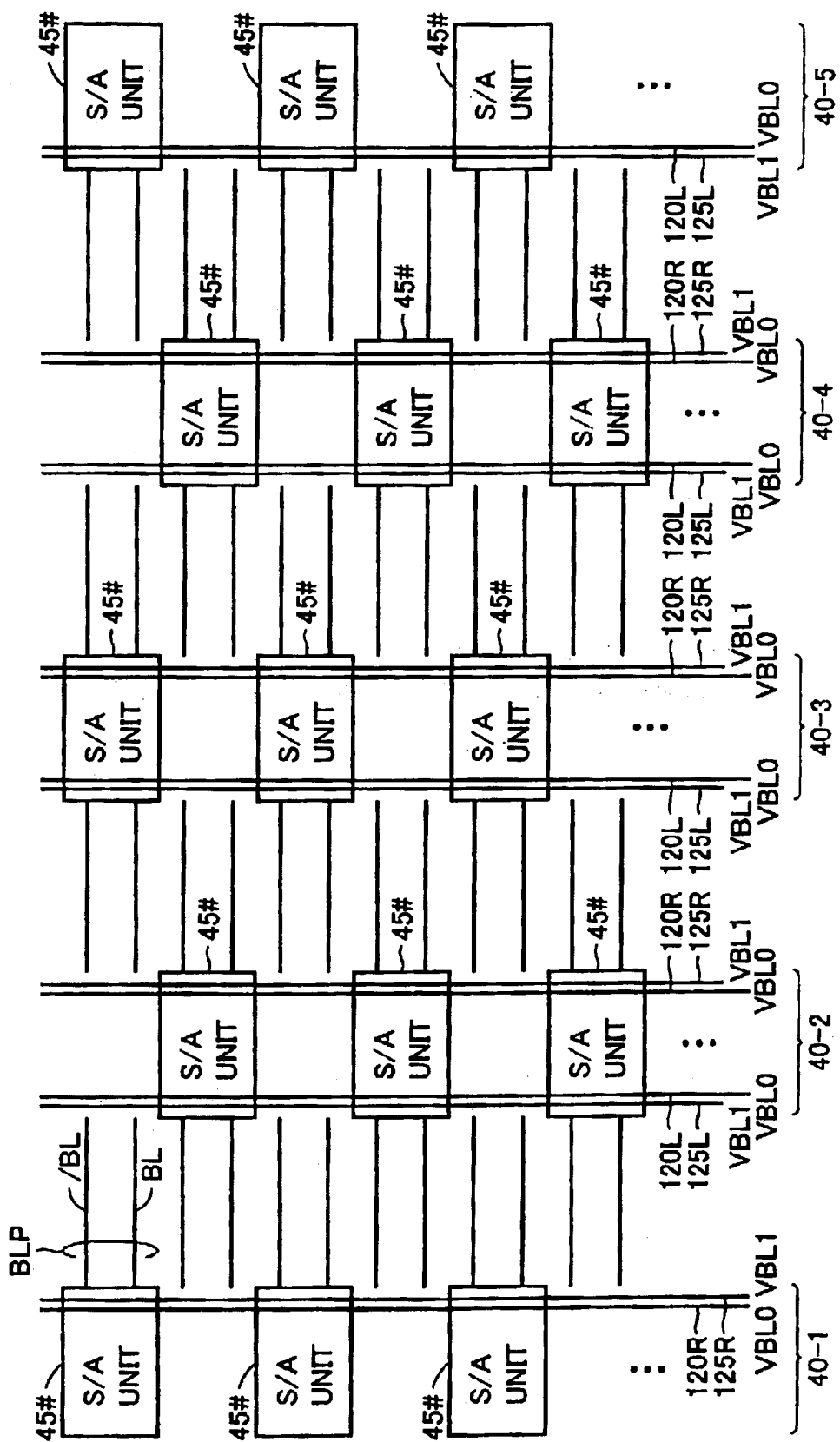
FIG. 7 is a block diagram for describing a modification of the supply of bit line voltages to the sense amplifier units according to the first embodiment on the entire memory cell array.

Alternatively, as shown in FIG. 7, bit line voltages VBL0 and VBL1 can be supplied to sense amplifier unit 45# in each of sense amplifier bands 40-1 to 40-5. In this case, it is possible to set the complementary bit lines of the respective bit line pairs at bit line voltages VBL0 and VBL1, respectively, without using the sense amplifier circuit in the burn-in test.

Even with such a configuration, by setting (VBL0, VBL1)=(L#, H#) or (H#, L#), it is possible to apply desired voltage stresses to minute leak paths SCb and SCc which are generated between the bit lines opposite in phase among those shown in FIG. 3 while separating each of the bit lines from the sense amplifier circuit. As for minute leak path SCa shown in FIG. 3, by setting (VBL0, VBL1)=(L#, L#) or (L#, H#) and appropriately setting the voltage of word line WL at H# or L#, a desired voltage stress can be applied thereto without using sense amplifier circuit 90.

Therefore, according to the modification shown in FIG. 7, a desired voltage stress cannot be applied to minute leak path SCd shown in FIG. 3 without using the sense amplifier circuit; however, it is possible to perform a burn-in test without destroying the thin film transistors while suppressing an increase in the number of types of bit line voltages.

SECOND EMBODIMENT

In a second embodiment, a configuration capable of performing an effective burn-in test using the configuration of the sense amplifier unit shown in FIG. 2 will be described.

Figure 8:
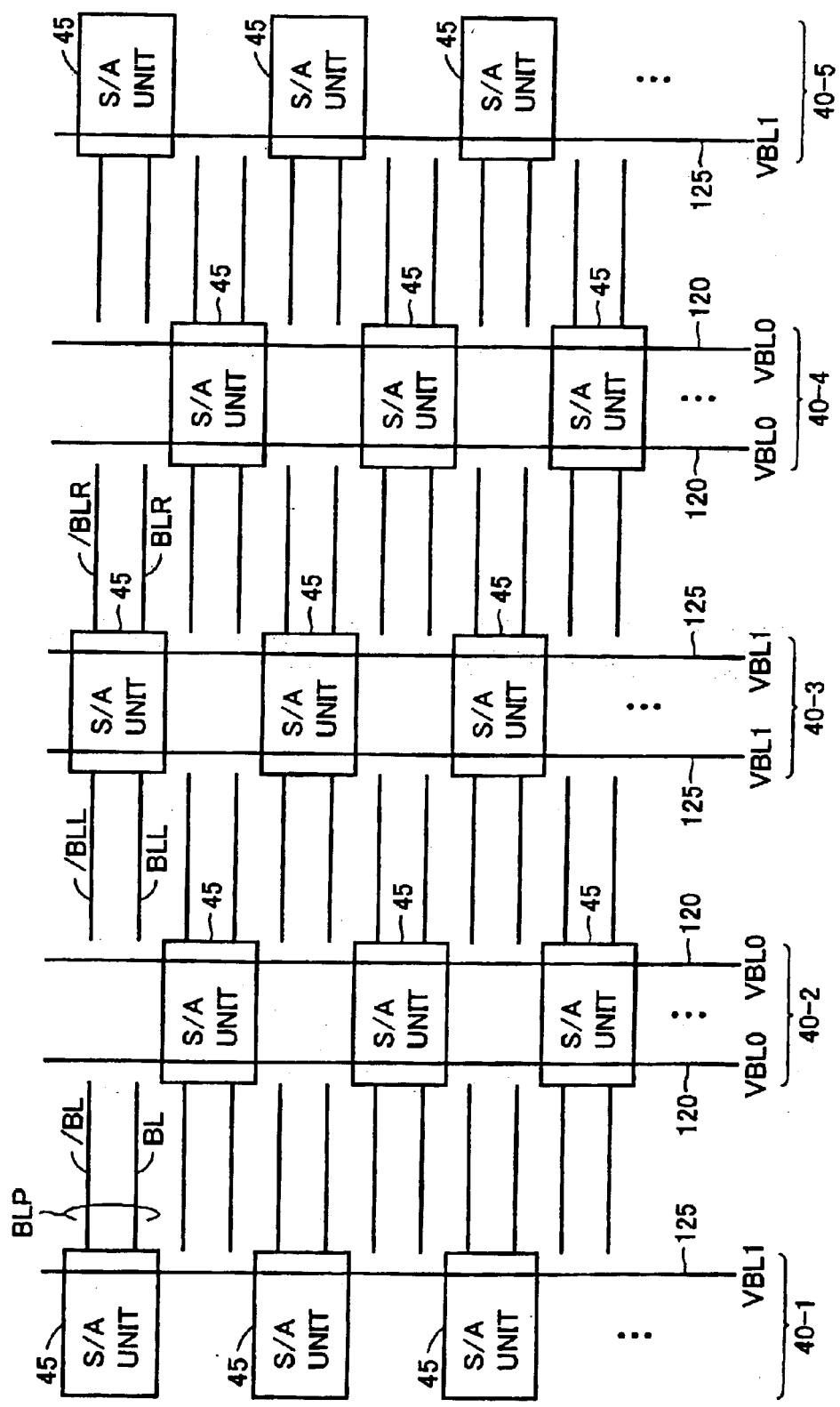
FIG. 8 is a block diagram for describing the supply of bit line voltages to sense amplifier units according to a second embodiment on an entire memory cell array.

FIG. 8 is a block diagram for describing the supply of bit line voltages to sense amplifier units according to a second embodiment on an entire memory cell array.

With reference to FIG. 8, the configuration according to the second embodiment is such that sense amplifier units 45 having the same circuit configurations as that shown in FIG. 2 are arranged in a plurality of sense amplifier bands 40-1 to 40-5, respectively in accordance with the same shared sense amplifier structure as those shown in FIGS. 5 and 7.

Bit line voltage VBL1 is supplied to sense amplifier unit 45 arranged in each of odd-numbered sense amplifier bands 40-1, 40-3 and 40-5 from a voltage node 125. Bit line voltage VBL0 is supplied to sense amplifier unit 45 arranged in each of even-numbered sense amplifier bands 40-2 and 40-4 from a voltage node 120.

In the configuration according to the second embodiment, bit line voltages VBL0 and VBL1 are supplied to switches 150 and 151 in the configuration shown in FIG. 6 by related sections, respectively. Therefore, voltage nodes 120 and 125 are set at predetermined precharge voltage VBL (Vcc/2) in a normal operation and independently set at one of H# level and L# level in a test mode.

Figure 9:
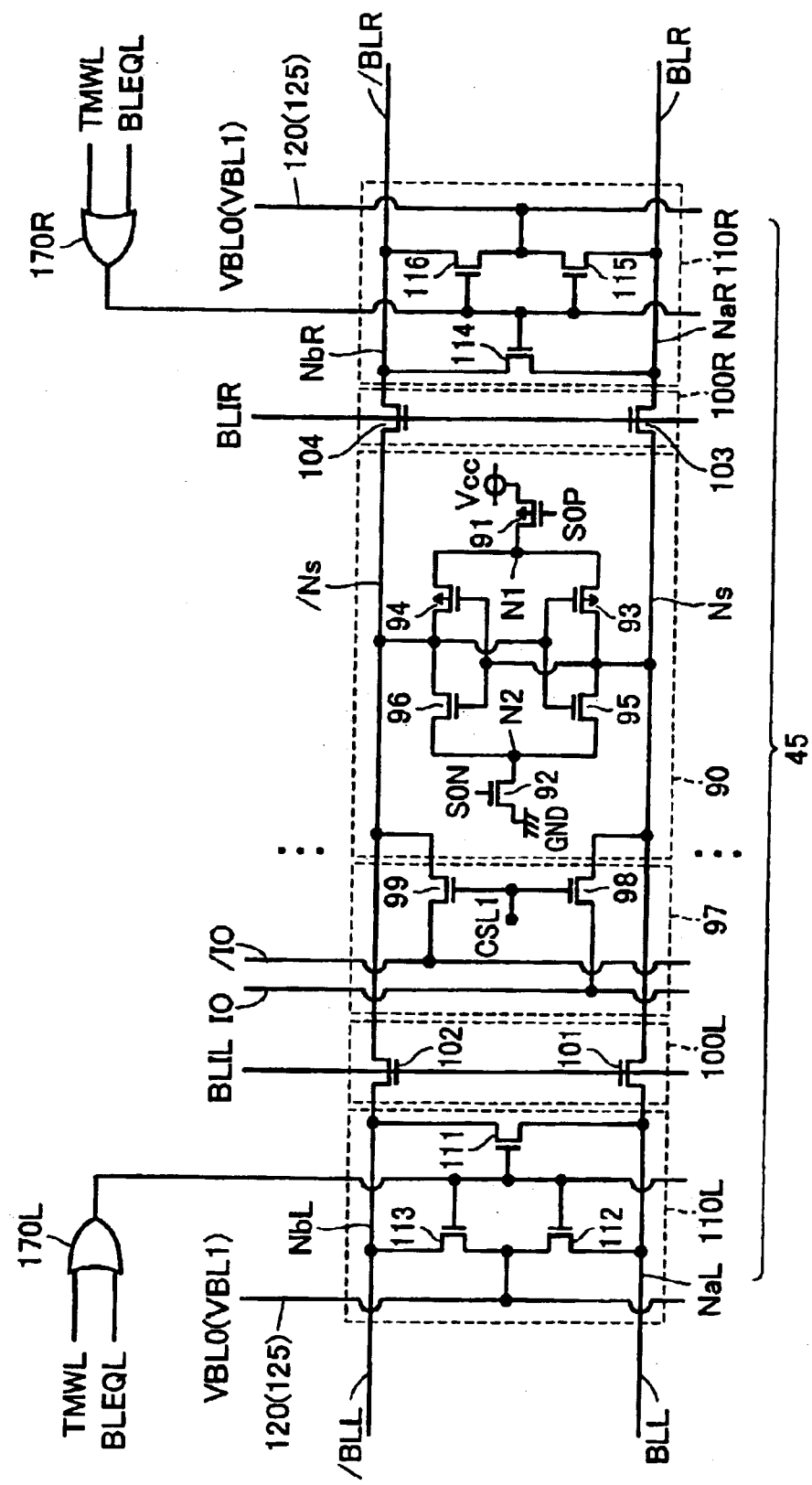
FIG. 9 is a circuit diagram showing the configuration of the sense amplifier unit according to the second embodiment.

FIG. 9 is a circuit diagram showing the configuration of the sense amplifier unit in the second embodiment.

With reference to FIG. 9, the configuration itself of sense amplifier unit 45 is the same as that shown in FIG. 2, which will not be repeatedly described herein.

However, it is noted that, as shown in FIG. 8, different bit line voltages VBL0 and VBL1 are supplied to precharge and equalization circuits 110L and 110R, respectively, in each of even-numbered and odd-numbered sense amplifier bands.

Further, the output signal of a logic gate 170L is inputted into each of the gates of transistor switches 111 to 113 which constitute precharge and equalization circuit 110L. Logic gate 170L outputs an OR operation result with respect to bit line equalization signal BLEQL shown in FIG. 2 and test mode signal TMWL shown in FIG. 4. As a result, transistor switches 111 to 113 are turned on in both a predetermined precharge and equalization period in the normal operation and the burn-in test, and connect corresponding voltage nodes 120 (125) to bit lines BLL and /BLL.

Likewise, an OR operation result with respect to bit line equalization signal BLEQR and test mode signal TMWL is applied to each of the gates of transistor switches 114 to 116 which constitute precharge and equalization circuit 110R by logic gate 170R. Accordingly, transistor switches 114 to 116 are turned on in both a predetermined precharge and equalization period in the normal operation and the burn-in test, and connect corresponding voltage nodes 120 (125) to bit lines BLR and /BLR.

In the normal operation, therefore, voltage nodes 120 and 125 are set at precharge voltage VBL (Vcc/2), making it possible to perform a predetermined precharge operation.

On the other hand, in the burn-in test, by setting (VBL0, VBL1)=(L#, L#) or (H#, H#) and appropriately setting the voltage of word line WL at H# level or L# level, it is possible to apply a desired voltage stress to minute leak path SCa shown in FIG. 3 without using sense amplifier circuit 90.

Moreover, by setting (VBL0, VBL1)=(H#, L#) or (L#, H#), it is possible to apply a desired voltage stress to minute leak paths SCc and SCd shown in FIG. 3 without using sense amplifier circuit 90.

Thus, although a desired voltage stress cannot be applied to minute leak path SCb shown in FIG. 3 without using the sense amplifier circuit, effective burn-in tests can be performed for minute leak paths SCa, SCc and SCd without destroying the thin film transistors.

With the configuration according to the second embodiment, in particular, the circuit configuration of the sense amplifier unit is the same as that of the typical sense amplifier unit. Therefore, although the types of part of the minute leak paths generated between the bit lines cannot be detected without using the sense amplifier circuit, it is advantageously possible to increase the number of types of the minute leak paths between the bit lines which can be detected, without increasing the circuit area of the sense amplifier unit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in a matrix;

a plurality of bit line pairs provided corresponding to columns of said plurality of memory cells; and a plurality of sense amplifier units provided corresponding to said plurality of bit line pairs, respectively, wherein each of said plurality of bit line pairs includes a first bit line and a second bit line, and each of said plurality of sense amplifier units includes:

a sense amplifier circuit connected to the corresponding first and second bit lines at least in data read; and a bit line switch for connecting the corresponding first and second bit lines to one and another one of a plurality of voltage nodes which can supply different voltages, respectively, in a test.

2. The semiconductor memory device according to claim 1, wherein in each of the sense amplifier units corresponding to the bit line pairs in odd numbers, said bit line switch connects the corresponding first and second bit lines to first and second voltage nodes among said plurality of voltage nodes, respectively, in said test, in each of the sense amplifier units corresponding to the bit line pairs in even numbers, said bit line switch connects the corresponding first and second bit lines to third and fourth voltage nodes among said plurality of voltage nodes, respectively, in said test, said semiconductor memory device further comprises first to fourth voltage switches provided corresponding to said first to fourth voltage nodes, respectively, and each of said first to fourth voltage switches selectively connects corresponding one of said first to fourth voltage nodes to one of different voltages.

3. The semiconductor memory device according to claim 1, wherein each of said plurality of sense amplifier units further includes a precharge and equalization circuit for coupling the corresponding first and second bit lines to a predetermined precharge voltage at a predetermined timing in a normal operation, and in said normal operation, each of said plurality of voltage nodes is set at said precharge voltage.

4. The semiconductor memory device according to claim 1, wherein in each of said plurality of memory cell columns, said first and second bit lines are connected to said one and said another one of said plurality of voltage nodes at first and second nodes, respectively, in said test, each of said plurality of sense amplifier units further includes a bit line separation switch for electrically separating said first and second nodes from said sense amplifier circuit in said test, and a gate insulation film of a transistor constituting said sense amplifier circuit is thinner than a gate insulation film of a transistor connected to said first and second bit lines in said test.

5. A semiconductor memory device comprising:

a plurality of memory cells arranged in a matrix;

a plurality of bit line pairs provided corresponding to columns of said plurality of memory cells; and a plurality of sense amplifier units provided corresponding to said plurality of bit line pairs, respectively, wherein each of said plurality of bit line pairs includes a first bit line and a second bit line, each of said plurality of sense amplifier units includes a sense amplifier circuit connected to the corresponding first and second bit lines at least in data read, each of the sense amplifier units corresponding to the bit line pairs in odd numbers further includes a first bit line switch for connecting the corresponding first and second bit lines to a first voltage node in a test, each of the sense amplifier units corresponding to the bit line pairs in even numbers further includes a second bit line switch for connecting the corresponding first and second bit lines to a second voltage node in said test, and voltages of said first and second voltage nodes can be set independently of each other in said test, wherein in each of said plurality of memory cell columns, said first and second bit lines are connected to corresponding one of said first and second voltage nodes at first and second nodes, respectively, in said test, each of said plurality of sense amplifier units further includes a bit line separation switch for electrically separating said first and second nodes from said sense amplifier circuit in said test, and a gate insulation film of a transistor constituting said sense amplifier circuit is thinner than a gate insulation film of a transistor connected to said first and second bit lines in said test.

* * * * *